United States Patent
Lee

(10) Patent No.: US 11,846,680 B2
(45) Date of Patent: Dec. 19, 2023

(54) BATTERY RESISTANCE DIAGNOSIS DEVICE AND METHOD

(71) Applicant: LG ENERGY SOLUTION, LTD., Seoul (KR)

(72) Inventor: Bum Hee Lee, Daejeon (KR)

(73) Assignee: LG Energy Solution, Ltd.

( * ) Notice: Subject to any disclaimer, the term of this patent is extended or adjusted under 35 U.S.C. 154(b) by 121 days.

(21) Appl. No.: 17/600,176

(22) PCT Filed: Jul. 17, 2020

(86) PCT No.: PCT/KR2020/009447
§ 371 (c)(1),
(2) Date: Sep. 30, 2021

(87) PCT Pub. No.: WO2021/015501
PCT Pub. Date: Jan. 28, 2021

(65) Prior Publication Data
US 2022/0155378 A1 May 19, 2022

(30) Foreign Application Priority Data
Jul. 22, 2019 (KR) .................. 10-2019-0088426

(51) Int. Cl.
*G01R 31/389* (2019.01)
*G01R 31/392* (2019.01)
(Continued)

(52) U.S. Cl.
CPC .......... *G01R 31/389* (2019.01); *G01R 27/14* (2013.01); *G01R 31/3648* (2013.01);
(Continued)

(58) Field of Classification Search
None
See application file for complete search history.

(56) References Cited

U.S. PATENT DOCUMENTS

| 4,968,942 A | 11/1990 | Palanisamy |
| 9,594,120 B2 | 3/2017 | Nonoyama |

(Continued)

FOREIGN PATENT DOCUMENTS

| CN | 102667513 A | 9/2012 |
| CN | 107290679 A | 10/2017 |

(Continued)

OTHER PUBLICATIONS

Extended European Search Report and European Search Opinion for European Patent Application No. 20843926.5 dated Mar. 22, 2022, 7 pgs.

(Continued)

*Primary Examiner* — Jas A Sanghera
(74) *Attorney, Agent, or Firm* — Lerner David LLP

(57) ABSTRACT

A battery resistance diagnosis device includes a current supply unit configured to supply a preset fixed current to a battery cell, a voltage measurement unit configured to measure an open circuit voltage of the battery cell while the fixed current is supplied, an external resistance calculation unit configured to calculate an external resistance value of the battery based on the fixed current and the open circuit voltage of the battery cell, and an abnormality diagnosis unit configured to diagnose a battery abnormality due to a voltage drop by comparing the calculated external resistance value with a preset external resistance value.

15 Claims, 6 Drawing Sheets

(51) Int. Cl.
*G01R 31/396* (2019.01)
*G01R 31/3835* (2019.01)
*G01R 27/14* (2006.01)
*G01R 31/36* (2020.01)

(52) U.S. Cl.
CPC ....... *G01R 31/3835* (2019.01); *G01R 31/392* (2019.01); *G01R 31/396* (2019.01)

(56) References Cited

U.S. PATENT DOCUMENTS

| | | | |
|---|---|---|---|
| 2002/0109506 A1 | 8/2002 | Kawakami et al. | |
| 2009/0171600 A1* | 7/2009 | Machiyama | G01R 31/379 702/63 |
| 2010/0156351 A1* | 6/2010 | Ugaji | H01M 10/48 320/132 |
| 2012/0256569 A1 | 10/2012 | Kawahara et al. | |
| 2012/0262180 A1 | 10/2012 | Ishishita | |
| 2012/0310562 A1* | 12/2012 | van Lammeren | G01R 31/389 702/63 |
| 2013/0245970 A1* | 9/2013 | Zhang | G01R 31/385 702/58 |
| 2013/0289908 A1 | 10/2013 | Nonoyama | |
| 2014/0253135 A1 | 9/2014 | Eguchi et al. | |
| 2016/0231390 A1* | 8/2016 | Sakakibara | G01R 31/371 |
| 2016/0349330 A1* | 12/2016 | Barfield, Jr. | G01R 31/389 |
| 2017/0149088 A1 | 5/2017 | Ueno et al. | |
| 2018/0203070 A1 | 7/2018 | Park | |
| 2018/0267108 A1 | 9/2018 | Morita et al. | |
| 2019/0081369 A1 | 3/2019 | Monden et al. | |
| 2019/0170831 A1 | 6/2019 | Sada | |
| 2019/0212395 A1 | 7/2019 | Chen et al. | |
| 2020/0269699 A1 | 8/2020 | Nakanishi et al. | |
| 2021/0103000 A1 | 4/2021 | Fujino et al. | |

FOREIGN PATENT DOCUMENTS

| | | |
|---|---|---|
| CN | 109239460 A | 1/2019 |
| CN | 109716612 A | 5/2019 |
| DE | 102016207571 A1 | 11/2017 |
| EP | 2657715 A2 | 10/2013 |
| EP | 3351953 A1 | 7/2018 |
| EP | 3376585 A1 | 9/2018 |
| EP | 3429053 A1 | 1/2019 |
| IN | 102576914 A | 7/2012 |
| JP | 3213740 B2 | 10/2001 |
| JP | 2003138750 A | 5/2003 |
| JP | 2010078572 A | 4/2010 |
| JP | 2011137682 A | 7/2011 |
| JP | 2011257411 A | 12/2011 |
| JP | 2013-044580 A | 3/2013 |
| JP | 2015186266 A | 10/2015 |
| JP | 2016180653 A | 10/2016 |
| JP | 2017125729 A | 7/2017 |
| JP | 2018038248 A | 3/2018 |
| JP | 2019002795 A | 1/2019 |
| KR | 20140066361 A | 6/2014 |
| KR | 2014-0103773 A | 8/2014 |
| KR | 101458128 B1 | 11/2014 |
| KR | 101562016 B1 | 11/2015 |
| KR | 101585453 B1 | 1/2016 |
| KR | 20160011448 A | 2/2016 |
| KR | 20160080802 A | 7/2016 |
| KR | 101779245 B1 | 9/2017 |
| KR | 101897522 B1 | 9/2018 |
| KR | 101989692 B1 | 6/2019 |
| WO | 2015-022731 A1 | 2/2015 |
| WO | 2017-154112 A1 | 9/2017 |
| WO | 2018181129 A1 | 10/2018 |

OTHER PUBLICATIONS

International Search Report for Application No. PCT/KR2020/009447, dated Oct. 28, 2020, 3 pages.

* cited by examiner

EXTERNAL RESISTANCE OF BMS
① INTERNAL RESISTANCE OF CELL
② LEAD RESISTANCE AT CONNECTION PART OF CELL
③ BUSBAR RESISTANCE
④ FPC PLATE RESISTANCE
⑤ FPC CONNECTION PART RESISTANCE
⑥ PCB PATTERN AND CONNECTOR RESISTANCE

BATTERY RESISTANCE DIAGNOSIS DEVICE AND METHOD

CROSS-REFERENCE TO RELATED APPLICATIONS

The present application is a national phase entry under 35 U.S.C. § 371 of International Application No. PCT/KR2020/009447 filed Jul. 17, 2020, published in Korean, which claims priority from Korean Patent Application No. 10-2019-0088426 filed on Jul. 22, 2019, in the Korean Intellectual Property Office, the disclosure of which is incorporated herein in its entirety by reference.

TECHNICAL FIELD

Technical Field

The present invention relates to a battery resistance diagnosis device and method for diagnosing a resistance abnormality by detecting a sudden change in resistance in a battery cell and a battery sensing line.

BACKGROUND ART

In general, as the resistance of the battery increases, an error in measuring the voltage of a battery cell occurs. Conventionally, in order to diagnose the resistance of the cell voltage measuring terminal of a battery, an increase in resistance according to the voltage drop is determined using an external resistance element, a maximum current, and a maximum voltage drop. In this algorithm, when the voltage measured in the intended diagnosis mode is greater than the maximum voltage drop (threshold value), it is determined that the resistance increases rapidly, and the battery system diagnoses an abnormality.

However, according to the conventional method of diagnosing battery cell resistance, since the voltage, SOC, and current included in each battery cell are not in the same state, a practical threshold value varies depending on the situation. Accordingly, in the battery system, a threshold value is defined as a maximum value in consideration of this fact, and the battery system operates with a fixed threshold value during the life cycle of the system. In this method, the deviation according to the production of battery products is also not reflected in the threshold value, and the threshold value may be set excessively large in the Golden Sample standard.

As described above, according to the conventional method for diagnosing battery cell resistance, it is difficult to accurately diagnose the resistance of the battery cell voltage measuring stage.

SUMMARY

Technical Problem

The present invention is to provide a battery resistance diagnosis device and method for detecting the resistance of the battery cells when each battery cell has the same voltage and current, that is, when in a fully charged state, to accurately diagnose the sudden change in resistance of the battery cell, and for diagnosing resistance due to cell voltage measurement errors to contribute to more accurate cell voltage measurements.

Technical Solution

A battery resistance diagnosis device according to an embodiment of the present invention includes a current source configured to supply a preset fixed current to a battery cell, a voltage sensor configured to measure an open circuit voltage of the battery cell while the fixed current is supplied, and a controller configured to calculate an external resistance value of the battery cell based on the fixed current and the open circuit voltage of the battery cell, and diagnose a battery abnormality due to a voltage drop by comparing the calculated external resistance value with a preset external resistance value.

In a battery resistance diagnosis device according to an embodiment of the present invention, the voltage sensor is configured to measure the open circuit voltage of the battery cell within a predetermined period of time, wherein the battery resistance diagnosis device may include a memory for storing the external resistance value calculated during the predetermined period of time based on the open circuit voltage of the battery cell measured during the predetermined period of time.

In a battery resistance diagnosis device according to an embodiment of the present invention, the preset resistance value may be an external resistance value initially calculated by the controller after the battery cell is fully charged, wherein the controller may be configured to diagnose the battery abnormality based on whether a difference between the calculated external resistance value and the preset resistance value is out of a predetermined range.

In a battery resistance diagnosis device according to an embodiment of the present invention, the predetermined range may be 10% of the external resistance value initially calculated by the controller.

In a battery resistance diagnosis device according to an embodiment of the present invention, the preset external resistance value may be an external resistance value calculated during a calculation period and stored in the memory with the external resistance value calculated during the predetermined period of time before the external resistance value is calculated, wherein the controller may be configured to diagnose the battery abnormality based on whether an amount of change from the preset external resistance value to the calculated external resistance value is out of a predetermined range.

In a battery resistance diagnosis device according to an embodiment of the present invention, the predetermined range may be 200% of the amount of change to the resistance value stored in the memory in the calculation period immediately before the predetermined period of time during which the external resistance value is calculated.

In a battery resistance diagnosis device according to an embodiment of the present invention, the resistance value of the battery may include at least one resistance value among an internal resistance of the battery cell, a lead resistance of a connection part of the battery cell, a busbar resistance, a flexible printed circuit (FPC) resistance, a printed circuit board (PCB) resistance, or a connector resistance.

In a battery resistance diagnosis device according to an embodiment of the present invention, the preset fixed current may be a balancing current of the battery.

In a battery resistance diagnosis method according to an embodiment of the present invention, the method includes supplying a preset fixed current to a battery cell, measuring an open circuit voltage of the battery cell while the fixed current is supplied, calculating, by a controller, an external resistance value of the battery cell based on the fixed current and the open circuit voltage of the battery cell, and diagnosing, by the controller, a battery abnormality due to a voltage drop by comparing the calculated external resistance value with a preset external resistance value.

In a battery resistance diagnosis method according to an embodiment of the present invention, the measuring of the open circuit voltage of the battery cell may include measuring the open circuit voltage of the battery cell within a predetermined period of time, wherein the method may further include storing in a memory the external resistance value calculated during the predetermined period of time based on the open circuit voltage of the battery cell measured during the predetermined period of time.

In a battery resistance diagnosis method according to an embodiment of the present invention, the preset resistance value may be an external resistance value initially calculated after the battery cell is fully charged, wherein diagnosing the battery abnormality may be based on whether a difference between the calculated external resistance value and the preset resistance value is out of a predetermined range.

In a battery resistance diagnosis method according to an embodiment of the present invention, the predetermined range may be 10% of the initially calculated external resistance value.

In a battery resistance diagnosis method according to an embodiment of the present invention, the preset external resistance value may be an external resistance value calculated during a calculation period and stored in the memory with the external resistance value calculated during the predetermined period of time before the external resistance value is calculated, wherein diagnosing the battery abnormality may be based on whether an amount of change from the preset external resistance value to the calculated external resistance value is out of a predetermined range.

In a battery resistance diagnosis method according to an embodiment of the present invention, the predetermined range may be 200% of the amount of change to the resistance value stored in the memory in the calculation period immediately before the predetermined period of time during which the external resistance value is calculated.

In a battery resistance diagnosis method according to an embodiment of the present invention, the resistance value of the battery may include at least one resistance value among an internal resistance of the battery cell, a lead resistance of a connection part of the battery cell, a busbar resistance, a FPC resistance, a PCB resistance, or a connector resistance.

In a battery resistance diagnosis method according to an embodiment of the present invention, the preset fixed current may be a balancing current of the battery.

Effects of the Invention

According to a battery resistance diagnosis device and method of the present invention, it is possible to detect the resistance of the battery cells when each battery cell has the same voltage and current, that is, when in a fully charged state, to accurately diagnose the sudden change in resistance of the battery cell, and diagnose resistance due to cell voltage measurement errors to contribute to more accurate cell voltage measurements.

DETAILED DESCRIPTION

Figure 1:
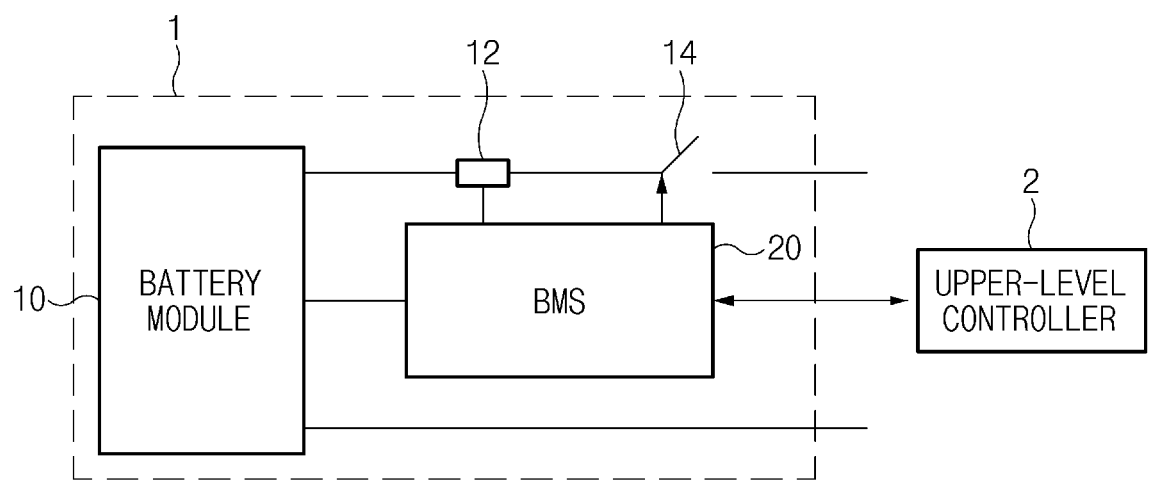
FIG. 1 is a block diagram showing the configuration of a general battery management system.

Hereinafter, various embodiments of the present invention will be described in detail with reference to the accompanying drawings. In this document, the same reference numerals are used for the same components in the drawings, and duplicate descriptions of the same components are omitted.

For the various embodiments of the present invention disclosed in this document, specific structural or functional descriptions have been exemplified for the purpose of describing the embodiments of the present invention only and various embodiments of the present invention may be implemented in various forms and should not be construed as being limited to the embodiments described in this document.

Expressions such as "first", "second", "first", or "second" used in various embodiments may modify various elements regardless of their order and/or importance, and do not limit the corresponding elements. For example, without departing from the scope of the present invention, a first component may be referred to as a second component, and similarly, a second component may be renamed and referred to as a first component.

Terms used in this document are only used to describe a specific embodiment, and may not be intended to limit the scope of other embodiments. The terms of a singular form may include plural forms unless otherwise specified.

All terms used herein, including technical or scientific terms, may have the same meaning as commonly understood by a person of ordinary skill in the art. Terms defined in a commonly used dictionary may be interpreted as having the same or similar meaning as the meaning in the context of the related technology, and are not interpreted as ideal or excessively formal meanings unless explicitly defined in this document. In some cases, even terms defined in this document cannot be interpreted to exclude embodiments of the present invention.

FIG. 1 is a block diagram showing the configuration of a general battery management system.

Referring to FIG. 1, a configuration diagram schematically shows a battery control system including a battery pack 1 and an upper-level controller 2 included in an upper-level system according to an embodiment of the present invention.

As shown in FIG. 1, the battery pack 1 includes a battery module 10 consisting of one or more battery cells and capable of charging and discharging, a switching unit 14 connected in series to the + terminal side or the − terminal side of the battery module 10 to control the charge/discharge current flow of the battery module 10, and a battery management system (BMS) 20 for controlling and managing the voltage, current, temperature, and the like of the battery module 10 to prevent overcharging and overdischarging. Here, although the battery management system 20 is described as being connected to the battery module, it is connected for each battery cell to monitor and measure the voltage and current temperature of the battery cells. A battery cell management system (not shown) is arranged for each battery cell, and each of the plurality of battery cell management systems may transmit and receive data to and from the battery management system 20 that monitors and controls the battery module. The battery cell management system is similar in operation and function to the battery management system 20.

Here, the switching unit 14 is a semiconductor switching element for controlling the current flow for charging or discharging the battery module 10, and, for example, at least one MOSFET may be used.

In addition, in order to monitor the voltage, current, temperature, and the like of the battery module 10, the BMS 20 may measure or calculate voltages and currents such as gates, sources, and drains of semiconductor switching elements, and in addition, measure the current, voltage, temperature, and the like of the battery module using the sensor 12 provided adjacent to the semiconductor switching unit 14. The BMS 20 is an interface for receiving values obtained by measuring the above-described various parameters, and may include a plurality of terminals and a circuit connected to these terminals to process input values.

In addition, the BMS 20 may control ON/OFF of the switching unit 14, for example, a MOSFET, and may be connected to the battery module 10 to monitor the state of the battery module 10.

The upper-level controller 2 may transmit a control signal for the battery module to the BMS 20. Accordingly, the operation of the BMS 20 may be controlled based on a signal applied from the upper-level controller. The battery cell of the present invention may be included in a battery pack used for an energy storage system (ESS) or a vehicle. However, it is not limited to these uses.

Since the configuration of the battery pack 1 and the configuration of the BMS 20 are known configurations, a more detailed description will be omitted.

Meanwhile, the battery cell diagnosis device according to embodiments of the present invention may be connected to each of a plurality of battery cells connected in series in the battery module 10 to determine an abnormality of the battery cell.

Figure 2:
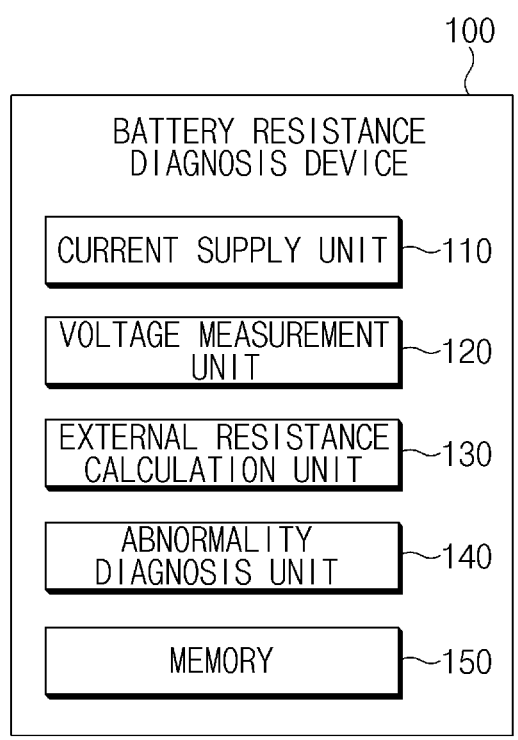
FIG. 2 is a block diagram showing the configuration of a battery resistance diagnosis device according to an embodiment of the present invention.

FIG. 2 is a block diagram showing the configuration of a battery resistance diagnosis device according to an embodiment of the present invention.

Referring to FIG. 2, the battery resistance diagnosis device 100 according to an embodiment of the present invention includes a current supply unit 110, a voltage measurement unit 120, an external resistance calculation unit 130, an abnormality diagnosis unit 140, and a memory 150.

The current supply unit 110 may supply a preset fixed current to the battery cell. For example, the fixed current supplied from the current supply unit 110 may be a current used in a balancing circuit (not shown) of a battery.

Here, the balancing circuit of the battery, as a circuit consisting of a resistor and a switching element connected to both ends of each battery cell, refers to a circuit that regulates the voltage of each battery cell to match by controlling the switching element to be ON/OFF under the control of the Battery Management System (BMS), and consuming the balancing current of the battery cell through resistance to reduce the voltage.

In particular, in the battery resistance diagnosis device 100 according to an embodiment of the present invention, when a battery cell is fully charged, measurement may be performed in a state in which the battery is open circuit voltage (OCV). As such, the current supply unit 110 performs a measurement when each battery cell is fully charged (for example, before the sleep mode), that is, when each battery cell has the same voltage and the same current, so that it is possible to make the diagnosis more accurately.

The voltage measurement unit 120 may measure an OCV of a battery cell while a fixed current is supplied by the current supply unit 110. In this case, the voltage measurement unit 120 may measure the voltage generated when the fixed current used in the existing battery balancing circuit is supplied to the resistance of the battery cell and the sensing line by the current supply unit 110.

In addition, the voltage measurement unit 120 may measure OCV of the battery cell at a predetermined period. In this case, the measurement period may be arbitrarily set by the user of the battery resistance diagnosis device 100 according to an embodiment of the present invention.

The external resistance calculation unit 130 may calculate an external resistance value of the battery based on the fixed current supplied by the current supply unit 110 and the OCV of the battery cell measured by the voltage measurement unit 120. For example, the external resistance calculation unit 130 may calculate the external resistance value of the battery cell by dividing the OCV when the battery is fully charged (100%) by the current of the balancing circuit.

Here, the external resistance value of the battery cell may include at least one resistance value of lead resistance, busbar resistance, Flexible Printed Circuit (FPC) resistance, Printed Circuit Board (PCB) resistance, and connector resistance at the connection part of the battery cell in addition to the internal resistance of the battery cell. This will be described later with reference to FIG. 3.

In addition, the external resistance calculation unit 130 may calculate a change in the resistance value based on a difference between the calculated external resistance value (i.e., the external resistance value calculated in the calculation period before the external resistance value is calculated in the external resistance calculation unit 130) and the external resistance value previously stored in the memory 150. For example, the amount of change in the resistance value may be a difference between the external resistance value currently calculated and the external resistance value calculated in the immediately previous calculation period stored in the memory 150.

The abnormality diagnosis unit 140 may diagnose a battery abnormality due to a voltage drop by comparing the external resistance value calculated by the external resistance calculation unit 130 with a preset external resistance value.

Specifically, the abnormality diagnosis unit 140 may diagnose a battery abnormality based on whether the difference between the resistance value calculated by the external resistance calculation unit 130 and the resistance value (i.e., the resistance value initially stored in the memory 150) initially calculated by the external resistance calculation unit 130 after the battery cell is fully charged is out of a predetermined range. In this case, after the battery cell is fully charged, the external resistance value initially calculated by the external resistance calculation unit 130 may be stored in the memory 150. In addition, the predetermined range may be 10% of the external resistance value initially calculated by the external resistance calculation unit 130.

In addition, the abnormality diagnosis unit 140 may diagnose a battery abnormality based on whether a change amount of the external resistance value calculated by the external resistance calculation unit 130 is out of a predetermined range. In this case, the amount of change in the external resistance value may include the amount of change from the external resistance value calculated in the calculation period before the calculated external resistance value is calculated and stored in the memory to the resistance value calculated by the external resistance calculation unit 130. Further, the predetermined range may be 200% of the change amount (i.e., the amount of change in the external resistance value calculated in the previous calculation period) to the resistance value calculated in the calculation period immediately before the external resistance value is calculated by the external resistance calculation unit 130.

Meanwhile, in the abnormality diagnosis unit 140, the above-described predetermined range with respect to the external resistance value and the amount of change in the external resistance value does not necessarily have to be a fixed value, and may be changed. For example, the abnormality diagnosis unit 140 may analyze patterns such as trends or fluctuations of changes in external resistance values and external resistance values through various analysis techniques such as machine learning or big data analysis, and diagnose an abnormality in the battery by detecting whether it deviates from the normal pattern.

The memory 150 may accumulate and store an external resistance value calculated in a predetermined period and a change amount of the external resistance value based on the OCV of the battery cell measured in a predetermined period by the voltage measurement unit 120 Accordingly, the abnormality diagnosis unit 140 may determine whether the battery is abnormal using an external resistance value stored in the memory 150. In this case, a period in which the memory 150 stores the external resistance value and the amount of change in the external resistance value may be arbitrarily set by the user of the battery resistance diagnosis device 100 according to an embodiment of the present invention.

In this way, according to the battery resistance diagnosis device according to an embodiment of the present invention, it is possible to detect the resistance of the battery cells when each battery cell has the same voltage and current, that is, when in a fully charged state, to accurately diagnose the sudden change in resistance of the battery cell, and diagnose resistance due to cell voltage measurement errors to contribute to more accurate cell voltage measurements.

Figure 3:
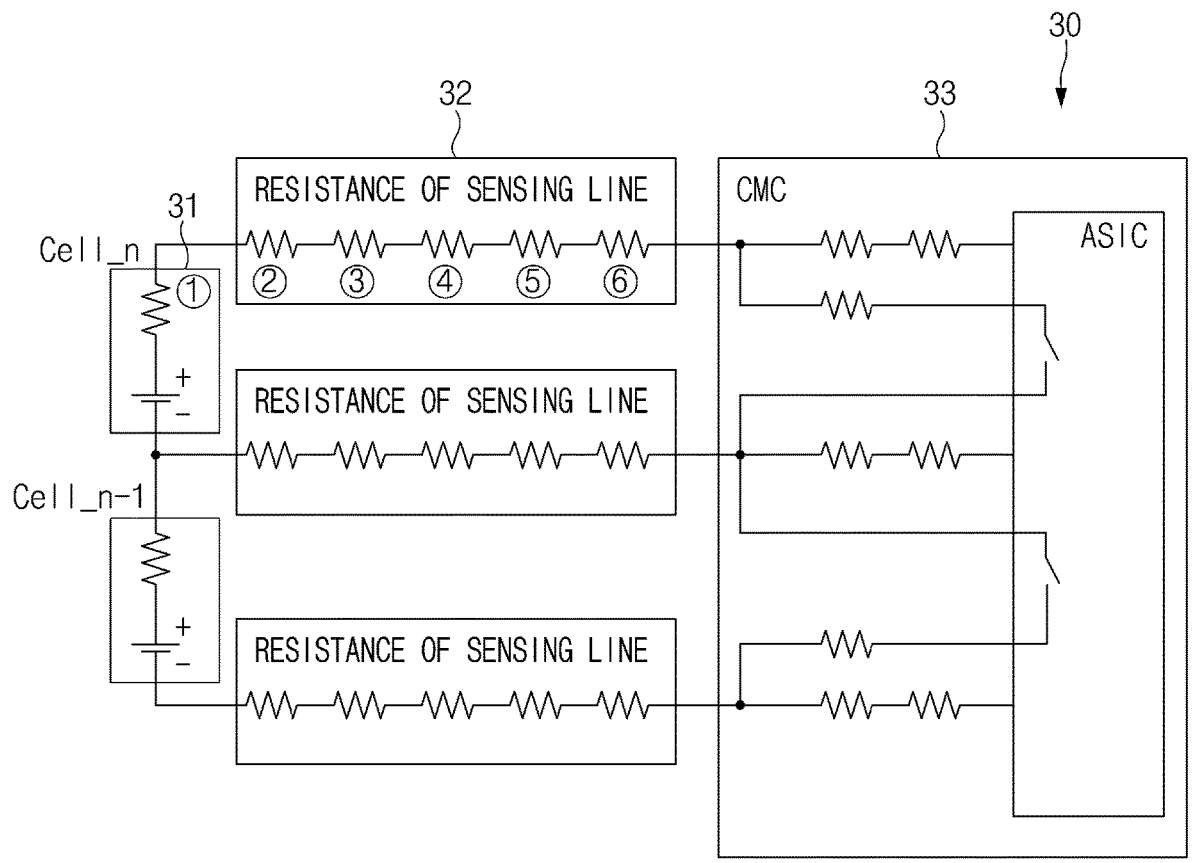
FIG. 3 shows a resistance configuration of a battery cell voltage measurement terminal according to an embodiment of the present invention.

FIG. 3 shows a resistance configuration of a battery cell voltage measurement terminal according to an embodiment of the present invention.

Referring to FIG. 3, a battery cell voltage measurement terminal 30 according to an embodiment of the present invention may include a battery cell 31, a sensing line 32, and a Cell Management Controller (CMC) 33.

According to the battery resistance diagnosis device according to an embodiment of the present invention, it is possible to measure all external resistance elements such as lead resistance ②, busbar resistance ③, FPC plate resistance ④, FPC connection part resistance ⑤, and PCB pattern and connector resistance ⑥ at the connection part of the battery cell included in the sensing line 32 between the battery cell 31 and the CMC 33 in addition to the internal resistance ① of the battery cell 31. However, the resistance elements shown in FIG. 3 are only exemplary, and any resistance elements that affect the increase (deterioration) of the resistance of the battery cell 31 may be included.

For example, the CMC 33 may be a slave battery management system (BMS). At this time, a slave battery management system is disposed in each battery cell. Each slave battery management system measures and monitors the temperature, voltage, or current of a plurality of battery cells, and transmits the monitored information to the upper-level system, and controls the connected battery cell by receiving a control command of the battery cell in the upper-level system.

The CMC 33 shown in FIG. 3 may include a processor that performs the battery cell diagnosis function described with reference to FIG. 2. In addition, the CMC is provided with a balancing circuit of the battery cells, so that a fixed current can be supplied to the battery cells to calculate resistance.

Figure 4:
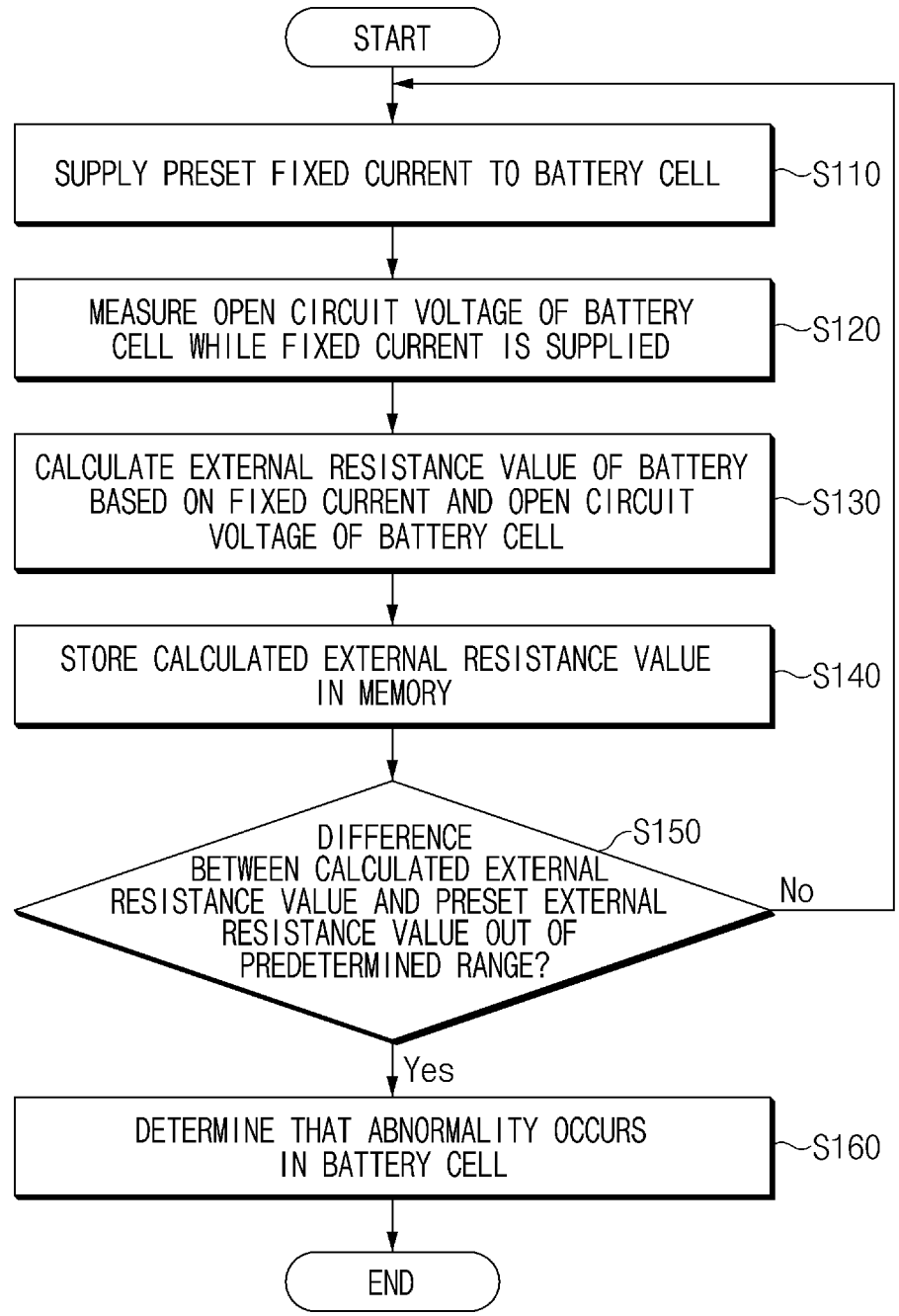
FIG. 4 is a flowchart of a method for diagnosing battery resistance according to an embodiment of the present invention.

FIG. 4 is a flowchart of a method for diagnosing battery resistance according to an embodiment of the present invention.

First, when the battery cell is fully charged and is converted to the OCV state, a preset fixed current is supplied to the battery cell (S110). Here, the supplied fixed current may be a current used in the balancing circuit of the battery.

As such, in operation S110, by starting the measurement in the fully charged state of the battery cell, diagnosis may be performed under the same voltage and current. Accordingly, in a conventional battery system, measurement errors due to differences in voltage, SOC, current, and the like for each battery cell can be reduced.

Then, while the fixed current is supplied to the battery cell, the OCV of the battery cell is measured (S120). In this case, a voltage generated when a fixed current used in a conventional balancing circuit of a battery is supplied to a resistance such as a battery cell and a sensing line may be measured. In addition, in operation S120, the OCV of the battery cell may be measured in a predetermined period. In this case, the measurement period may be arbitrarily set by a user of the battery resistance diagnosis device according to an embodiment of the present invention.

Next, an external resistance value of the battery is calculated based on the fixed current and OCV of the battery cell (S130). In this case, the external resistance value of the battery cell can be calculated by dividing the OCV at the time of full charge (100%) by the current of the balancing circuit. In operation S140, the external resistance value calculated in operation S130 is stored in the memory.

Then, it is determined whether the difference between the external resistance value calculated in operation S130 and a preset external resistance value is out of a predetermined range (S150). For example, the preset external resistance value may include an external resistance value initially calculated after the battery cell is fully charged (i.e., a resistance value initially stored in the memory 150). In addition, the predetermined range may be 10% of the initially calculated external resistance value.

When the difference between the external resistance value calculated in operation S150 and the preset external resistance value does not exceed a predetermined range (NO), the process returns to operation S110.

If the difference between the external resistance value calculated in operation S150 and the preset external resistance value is out of a predetermined range (YES), it is determined that an abnormality has occurred in the battery cell (S160).

As described above, according to FIG. 4, it is possible to detect whether a sudden change in resistance is based on whether it deviates from a predetermined threshold value based on the first measured external resistance value.

Figure 5:
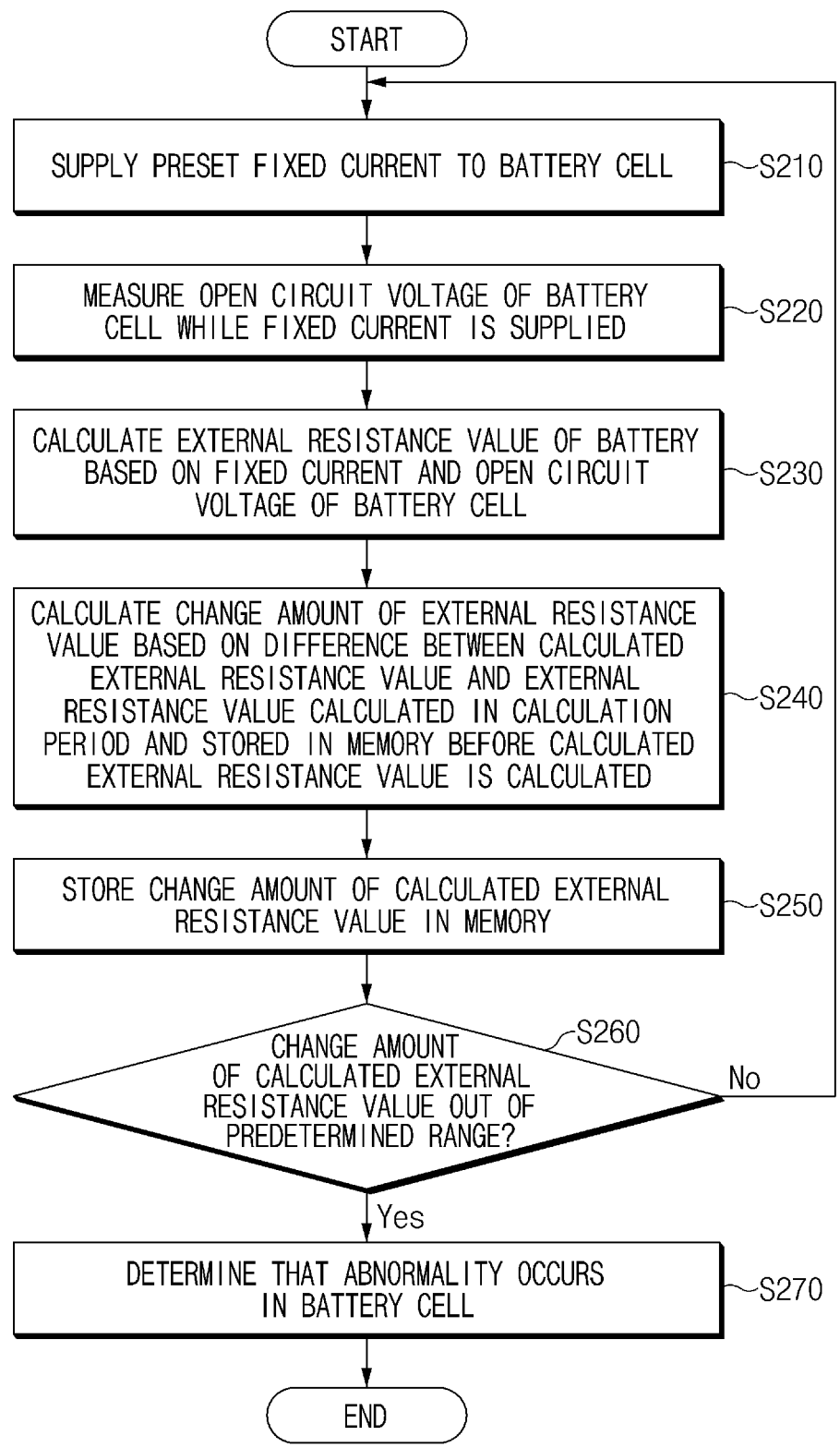
FIG. 5 is a flowchart of a method for diagnosing battery resistance according to another embodiment of the present invention.

FIG. 5 is a flowchart of a method for diagnosing battery resistance according to another embodiment of the present invention.

Operations S210 to S230 of FIG. 5 are the same as those of FIG. 4, and thus detailed descriptions thereof will be omitted.

In operation S240, a change amount of the external resistance value is calculated based on a difference between the calculated external resistance value and the external resistance value stored in the memory in a calculation period before the calculated external resistance value is calculated. For example, the amount of change in the external resistance value may be a difference between the current calculated resistance value and the resistance value calculated in the immediately previous calculation period stored in the memory. Then, the calculated change amount of the external resistance value is stored in the memory (S250).

Next, it is determined whether the amount of change in the external resistance value is out of a predetermined range (S260). In this case, the predetermined range may be 200% of the change amount (i.e., the amount of change in the external resistance value calculated in the immediately previous calculation period) to the resistance value stored in the memory in the calculation period immediately before the external resistance value is calculated.

If the external resistance value calculated in operation S260 does not exceed a predetermined range (NO), the process returns to operation S210.

If the external resistance value calculated in step S260 is out of a predetermined range (YES), it is determined that an abnormality has occurred in the battery cell (S270).

As described above, according to FIG. 5, it is possible to diagnose whether the degree of variation (deterioration) of resistance compared to accumulated data has rapidly progressed using the amount of change (e.g., the amount of change in the resistance value calculated immediately before) in the external resistance value.

On the other hand, herein, although the description has been divided into FIGS. 4 and 5, by performing the detection of the resistance change according to FIG. 4 and the detection of the change amount of the resistance according to FIG. 5 together, when both the external resistance value and the amount of change in the external resistance value exceed the reference value, it may be determined that an abnormality has occurred in the battery cell.

In this way, according to the battery resistance diagnosis method according to an embodiment of the present invention, it is possible to detect the resistance of the battery cells when each battery cell has the same voltage and current, that is, when in a fully charged state, to accurately diagnose the sudden change in resistance of the battery cell, and diagnose resistance due to cell voltage measurement errors to contribute to more accurate cell voltage measurements.

Figure 6:
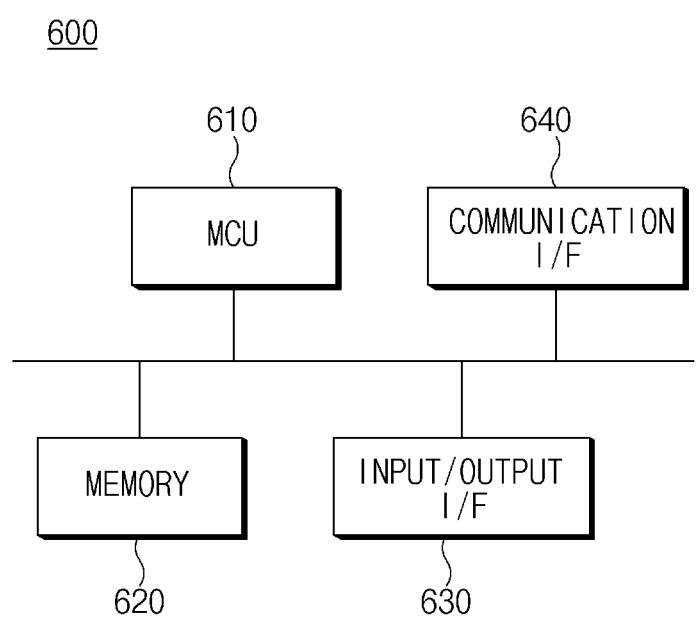
FIG. 6 is a block diagram showing a hardware configuration of a battery resistance diagnosis device according to an embodiment of the present invention.

FIG. 6 is a block diagram showing a hardware configuration of a battery resistance diagnosis device according to an embodiment of the present invention.

As shown in FIG. 6, the battery resistance diagnosis device 600 may include a microcontroller unit (MCU) 610 that controls various processes and configurations, a memory 620 in which an operating system program and various programs (e.g., a battery pack abnormality diagnosis program, or a battery pack temperature estimation program) are recorded, an input/output interface 630 that provides an input interface and an output interface between a battery cell module and/or a switching unit (e.g., a semiconductor switching element), and a communication interface 640 capable of communicating with an external (for example, upper-level controller) through a wired or wireless communication network. In this way, the computer program according to the present invention may be recorded in the memory 620 and processed by the MCU 610, and for example, may be implemented as a module that performs each functional block shown in FIG. 2.

In the above, even if all the components constituting the embodiments of the present invention are described as being combined into one or operating in combination, the present invention is not necessarily limited to these embodiments. That is, within the scope of the object of the present invention, all of the constituent elements may be selectively combined and operated in one or more.

In addition, terms such as "include", "consist of" or "have" described above mean that the corresponding constituent components can be present unless otherwise stated, and it should be construed that other components may be further included rather than excluding other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and unless explicitly defined in the present invention, they are not interpreted in an ideal or excessively formal sense.

The above description is merely illustrative of the technical idea of the present invention, and those of ordinary skill in the art to which the present invention pertains will be able to make various modifications and variations without departing from the essential characteristics of the present invention. Therefore, the embodiments disclosed in the present invention are not intended to limit the technical idea of the present invention, but to explain, and the scope of the technical idea of the present invention is not limited by these embodiments. The scope of protection of the present invention should be interpreted by the claims below, and all technical ideas within the scope equivalent thereto should be construed as being included in the scope of the present invention.

The invention claimed is:

1. A battery resistance diagnosis device comprising:
   a current source configured to supply a preset fixed current to a battery cell;
   a voltage sensor configured to measure an open circuit voltage of the battery cell while the fixed current is supplied, wherein the battery cell is in an open circuit voltage state after being charged and the fixed current is supplied from a balancing current of the battery subsequent to the charging; and
   a controller configured to:
      calculate an external resistance value of the battery cell based on the fixed current and the open circuit voltage of the battery cell; and
      diagnose a battery abnormality due to a voltage drop by comparing the calculated external resistance value with a preset external resistance value.

2. The battery resistance diagnosis device of claim 1, wherein the voltage sensor is configured to measure the open circuit voltage of the battery cell within a predetermined period of time,
   wherein the battery resistance diagnosis device further comprises a memory for storing the external resistance value calculated during the predetermined period of time based on the open circuit voltage of the battery cell measured during the predetermined period of time.

3. The battery resistance diagnosis device of claim 2, wherein the preset external resistance value is an external resistance value initially calculated by the controller after the battery cell is fully charged, wherein the controller is configured to diagnose the battery abnormality based on whether a difference between the calculated external resistance value and the preset external resistance value is out of a predetermined range.

4. The battery resistance diagnosis device of claim 3, wherein the predetermined range is 10% of the external resistance value initially calculated by the controller.

5. The battery resistance diagnosis device of claim 2, wherein the preset external resistance value is an external resistance value calculated during a calculation period and stored in the memory with the external resistance value calculated during the predetermined period of time before the external resistance value is calculated,
wherein the controller is configured to diagnose the battery abnormality based on whether an amount of change from the preset external resistance value to the calculated external resistance value is out of a predetermined range.

6. The battery resistance diagnosis device of claim 5, wherein the predetermined range is 200% of the amount of change to the resistance value stored in the memory in the calculation period immediately before the predetermined period of time during which the external resistance value is calculated.

7. The battery resistance diagnosis device of claim 1, wherein the external resistance value of the battery comprises at least one resistance value among an internal resistance of the battery cell, a lead resistance of a connection part of the battery cell, a busbar resistance, a flexible printed circuit (FPC) resistance, a printed circuit board (PCB) resistance, or a connector resistance.

8. The battery resistance diagnosis device of claim 1, wherein the controller is configured to diagnose the battery abnormality based on at least one of big data analysis and machine learning.

9. A battery resistance diagnosis method comprising:
supplying a preset fixed current to a battery cell;
measuring an open circuit voltage of the battery cell while the fixed current is supplied wherein the battery cell is in an open circuit voltage state after being charged and the fixed current is supplied from a balancing current of the battery subsequent to the charging;
calculating, by a controller, an external resistance value of the battery cell based on the fixed current and the open circuit voltage of the battery cell; and
diagnosing, by the controller, a battery abnormality due to a voltage drop by comparing the calculated external resistance value with a preset external resistance value.

10. The method of claim 9, wherein measuring the open circuit voltage of the battery cell comprises measuring the open circuit voltage of the battery cell within a predetermined period of time,
wherein the method further comprises storing in a memory the external resistance value calculated during the predetermined period of time based on the open circuit voltage of the battery cell measured during the predetermined period of time.

11. The method of claim 10, wherein the preset external resistance value is an external resistance value initially calculated after the battery cell is fully charged,
wherein diagnosing the battery abnormality is based on whether a difference between the calculated external resistance value and the preset external resistance value is out of a predetermined range.

12. The method of claim 11, wherein the predetermined range is 10% of the initially calculated external resistance value.

13. The method of claim 10, wherein the preset external resistance value is an external resistance value calculated during a calculation period and stored in the memory with the external resistance value calculated during the predetermined period of time before the external resistance value is calculated,
wherein diagnosing the battery abnormality is based on whether an amount of change from the preset external resistance value to the calculated external resistance value is out of a predetermined range.

14. The method of claim 13, wherein the predetermined range is 200% of the amount of change to the resistance value stored in the memory in the calculation period immediately before the predetermined period of time during which the external resistance value is calculated.

15. The method of claim 9, wherein the external resistance value of the battery comprises at least one resistance value among an internal resistance of the battery cell, a lead resistance of a connection part of the battery cell, a busbar resistance, a FPC resistance, a PCB resistance, or a connector resistance.

* * * * *